US012753069B2

(12) United States Patent
Nishinohara et al.

(10) Patent No.: US 12,753,069 B2
(45) Date of Patent: Oct. 6, 2026

(54) MEMS DEVICE

(71) Applicant: ROHM Co., LTD., Kyoto (JP)

(72) Inventors: Daisuke Nishinohara, Kyoto (JP); Toma Fujita, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 245 days.

(21) Appl. No.: 18/768,298

(22) Filed: Jul. 10, 2024

(65) Prior Publication Data

US 2025/0019225 A1 Jan. 16, 2025

(30) Foreign Application Priority Data

Jul. 14, 2023 (JP) ................................ 2023-116197

(51) Int. Cl.
*B81B 3/00* (2006.01)
*G01P 15/125* (2006.01)

(52) U.S. Cl.
CPC .......... *B81B 3/0056* (2013.01); *G01P 15/125* (2013.01); *B81B 2201/0235* (2013.01); *B81B 2203/0118* (2013.01); *B81B 2203/0136* (2013.01); *B81B 2203/0163* (2013.01); *B81B 2203/0307* (2013.01); *B81B 2203/0315* (2013.01); *B81B 2203/04* (2013.01)

(58) Field of Classification Search
None
See application file for complete search history.

(56) References Cited

U.S. PATENT DOCUMENTS 8,205,497 B1 * 6/2012 Okandan ............ G01C 19/5712 73/514.26

FOREIGN PATENT DOCUMENTS

EP 3347674 B1 * 7/2020 ............ H03H 9/125
JP 2023020325 2/2023

* cited by examiner

*Primary Examiner* — Eric S. McCall
*Assistant Examiner* — Nigel H Plumb
(74) *Attorney, Agent, or Firm* — CHIP LAW GROUP

(57) ABSTRACT

Provided is a MEMS device including a substrate that has a first principal surface and a second principal surface facing the first principal surface, and in which a cavity recessed from the first principal surface side to the second principal surface side is disposed, and a MEMS electrode that is disposed within the cavity, and that is separated from a bottom surface of the cavity to the first principal surface side. The MEMS includes a movable electrode finger, a fixed electrode finger, a beam portion, and an electrode portion. The electrode portion includes a first electrode finger and a second electrode finger.

4 Claims, 5 Drawing Sheets

MEMS DEVICE

CROSS REFERENCE TO RELATED APPLICATIONS

This application claims priority benefit of Japanese Patent Application No. JP 2023-116197 filed in the Japan Patent Office on Jul. 14, 2023. Each of the above-referenced applications is hereby incorporated herein by reference in its entirety.

BACKGROUND

The present disclosure relates to a micro electro mechanical system (MEMS) device.

Japanese Patent Laid-Open No. 2023-020325 discloses a capacitive MEMS sensor including a fixed electrode and a movable electrode that mesh with and face each other in a shape of comb teeth. The fixed electrode and the movable electrode described in Japanese Patent Laid-Open No. 2023-020325 are formed by etching a semiconductor substrate.

DETAILED DESCRIPTION

In the following, a MEMS device according to an embodiment of the present disclosure will be described with reference to the accompanying drawings. It is to be noted that the following description is essentially merely illustrative, and is not intended to limit the present disclosure, objects to which the present disclosure is applied, or applications of the present disclosure. In addition, the drawings are schematic, and ratios between dimensions, for example, are different from actual ones.

Acceleration Sensor

Figure 1:
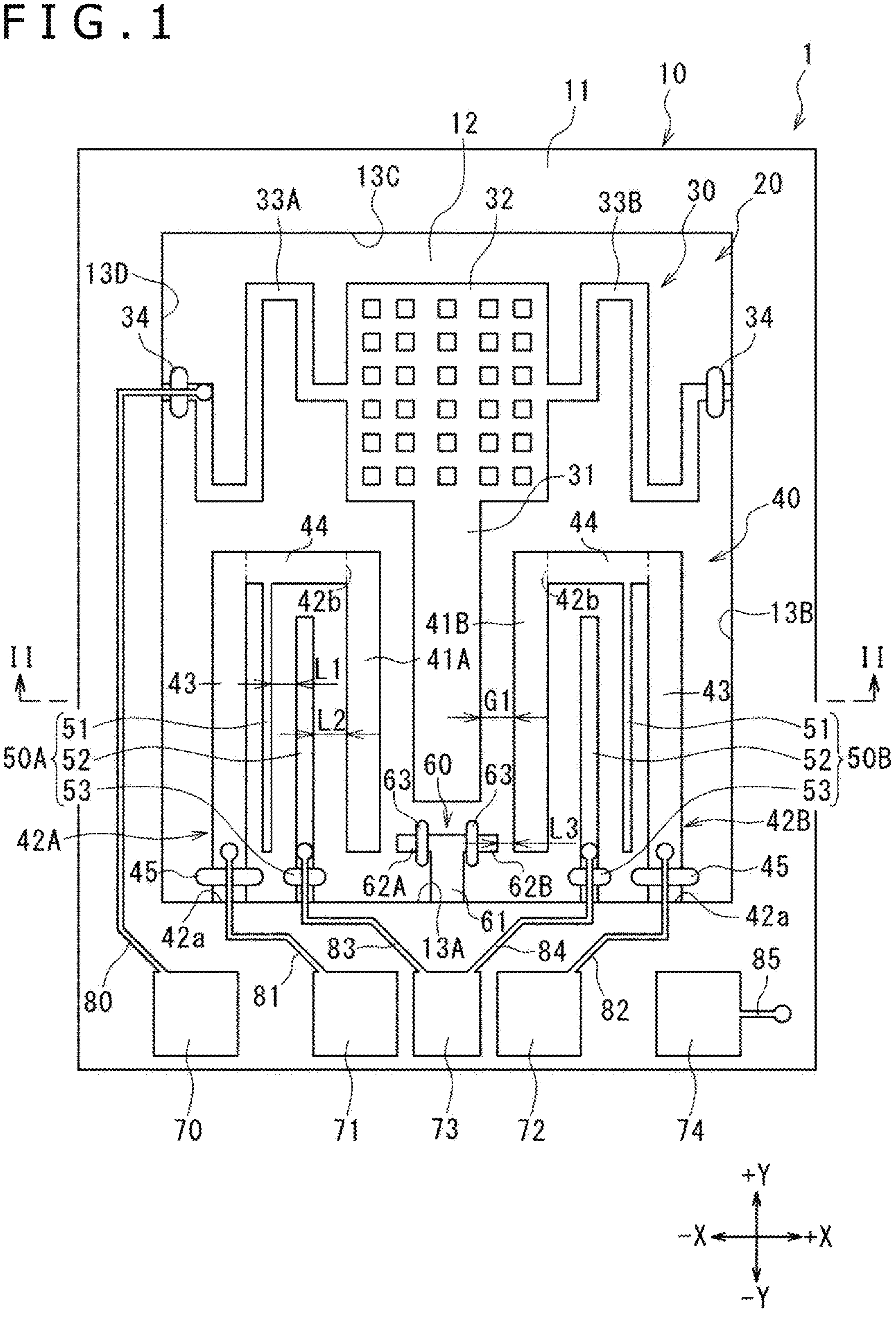
FIG. 1 is a plan view of an acceleration sensor according to one embodiment of the present disclosure.
Figure 2:
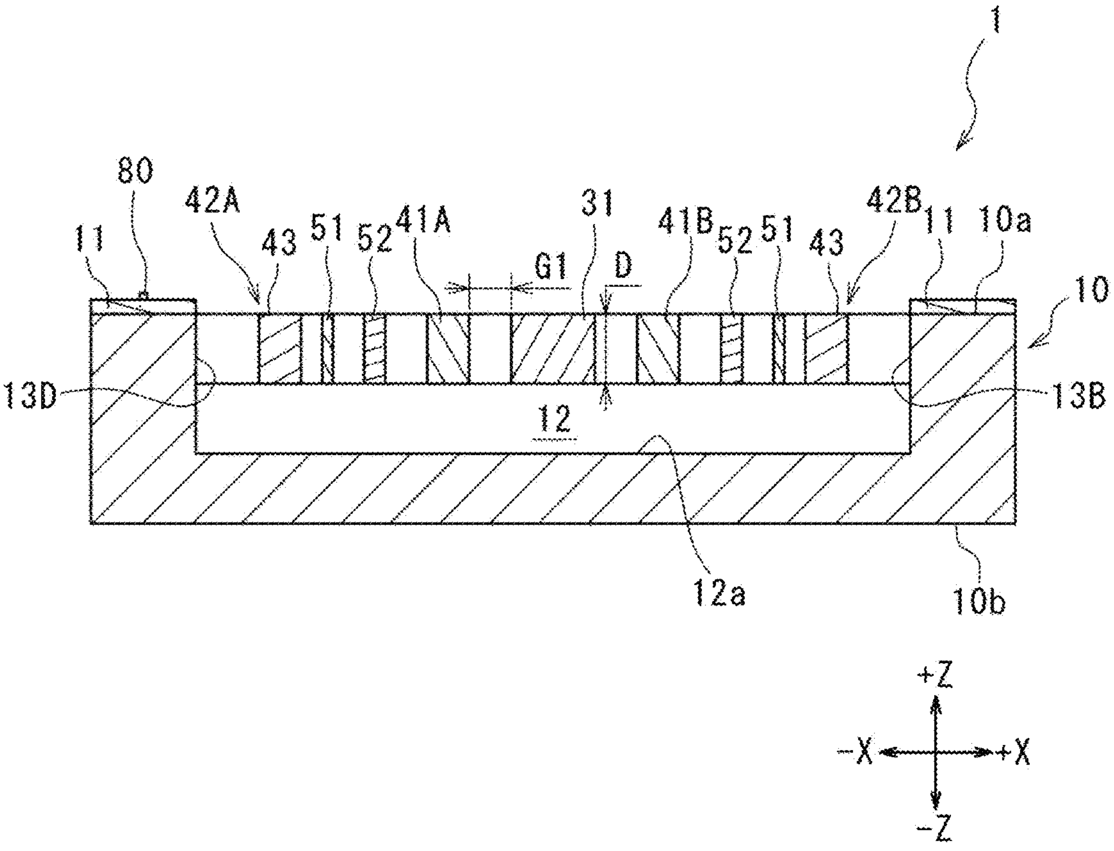
FIG. 2 is a sectional view taken along a line II-II of FIG. 1.

FIG. 1 is a plan view schematically illustrating an acceleration sensor 1 according to one embodiment of the present disclosure. FIG. 2 is a sectional view taken along a line II-II of FIG. 1. The acceleration sensor 1 according to the present embodiment is a capacitive acceleration sensor manufactured by using a semiconductor microfabrication technology. The acceleration sensor 1 according to the present embodiment is an example of a MEMS device according to the present disclosure.

In the following description, for convenience, a left-right direction in FIG. 1 among directions along respective sides of the acceleration sensor 1 as viewed in the plan view illustrated in FIG. 1 will be referred to as an X-direction, an upward-downward direction in FIG. 1 will be referred to as a Y-direction, and a thickness direction of the acceleration sensor 1 as viewed in the sectional view illustrated in FIG. 2 (upward-downward direction in FIG. 2) will be referred to as a Z-direction. In particular, a right side, a left side, an upper side, and a lower side in FIG. 1 may be respectively referred to as a +X direction, a −X direction, a +Y direction, and a −Y direction. An upper side and a lower side in FIG. 2 may be referred to as a +Z direction and a −Z direction, respectively. The X-direction, the Y-direction, and the Z-direction in the present embodiment are orthogonal to one another. The X-direction according to the present embodiment is an example of a second direction according to the present disclosure. The Y-direction according to the present embodiment is an example of a first direction according to the present disclosure.

Referring to FIG. 1 and FIG. 2, the acceleration sensor 1 includes a substrate 10 and a MEMS electrode 20 provided within the substrate 10.

The substrate 10 has a rectangular shape as viewed in plan. The substrate 10 has a first principal surface 10*a* located on a +Z side and a second principal surface 10*b* that is located on a −Z side and faces the first principal surface 10*a*. The substrate 10 is a conductive silicon (Si) substrate. The substrate 10 according to the present embodiment is formed by only a single silicon layer. The first principal surface 10*a* and the second principal surface 10*b* have a planar shape extending in the X-direction and the Y-direction. The first principal surface 10*a* and the second principal surface 10*b* extend in parallel with each other. An insulating layer 11 is disposed on the first principal surface 10*a* of the substrate 10. A cavity 12 recessed from the first principal surface 10*a* to the −Z side and having a rectangular shape as viewed in plan is formed in the substrate 10.

The substrate 10 has four inner wall surfaces 13A to 13D that define the cavity 12 in the X-direction and the Y-direction. In the following description, in cases where the four inner wall surfaces 13A to 13D do not particularly need to be distinguished from one another, one of the four inner wall surfaces 13A to 13D may be referred to simply as an inner wall surface 13.

The inner wall surface 13A has a planar shape extending in the X-direction and the Z-direction, and defines the −Y side of the cavity 12.

The inner wall surface 13B has a planar shape extending in the Y-direction and the Z-direction, and defines the +X side of the cavity 12.

The inner wall surface 13C has a planar shape extending in the X-direction and the Z-direction, and defines the +Y side of the cavity 12.

The inner wall surface 13D has a planar shape extending in the Y-direction and the Z-direction, and defines the −X side of the cavity 12.

The MEMS electrode 20 includes a movable electrode 30 and a fixed electrode 40. The movable electrode 30 and the fixed electrode 40 are arranged within the cavity 12.

The movable electrode 30 is separated from a bottom surface 12*a* of the cavity 12 to the +Z side. The movable electrode 30 includes a movable electrode finger 31 extending in the Y-direction, a base portion 32 to which a +Y side end portion of the movable electrode finger 31 is connected, and two spring portions 33A and 33B that connect the base portion 32 and the substrate 10 to each other. In the following description, in cases where the spring portions 33A and 33B do not particularly need to be distinguished from each other, one of the two spring portions 33A and 33B may be referred to simply as to a spring portion 33.

The movable electrode finger 31 includes a conductive silicon (Si) layer. The movable electrode finger 31 is connected to the substrate 10 so as to be movable in the X-direction relative to the substrate 10. The movable electrode finger 31 is coupled to the substrate 10 via the base portion 32 and the spring portions 33A and 33B. The movable electrode finger 31 according to the present embodiment is indirectly supported by the inner wall surface 13B and the inner wall surface 13D via the base portion 32 and the spring portions 33A and 33B.

The base portion 32 includes a conductive silicon (Si) layer. The base portion 32 functions as a proof mass of the acceleration sensor 1. The base portion 32 is connected to the substrate 10 so as to be movable in the X-direction relative to the substrate 10. Specifically, the base portion 32 is coupled to the substrate 10 via the spring portions 33A and 33B. The base portion 32 is indirectly supported by the inner wall surface 13B and the inner wall surface 13D via the spring portions 33A and 33B.

The spring portion 33 includes a conductive silicon (Si) layer. The spring portion 33 is cantilevered by the inner wall surface 13 extending in the Y-direction and the Z-direction of the substrate 10. Specifically, the spring portion 33A is cantilevered by the inner wall surface 13D of the substrate 10, and the spring portion 33B is cantilevered by the inner wall surface 13B of the substrate 10. The spring portion 33 projects into the cavity 12 from the inner wall surface 13 extending in the Y-direction and the Z-direction of the substrate 10. The spring portions 33A and 33B are respectively arranged on the −X side and the +X side of the base portion 32. The spring portion 33 is configured to be able to expand and contract in the X-direction. When an acceleration in the X-direction acts on the base portion 32, the spring portions 33A and 33B are elastically deformed, and thereby the movable electrode finger 31 is displaced in the X-direction.

The movable electrode 30 has an isolation joint 34 that crosses the spring portion 33 in the Y-direction and the Z-direction and severs the spring portion 33 in the X-direction. The isolation joint 34 electrically insulates parts on both sides of the spring portion 33 which parts are severed in the X-direction by the isolation joint 34 from each other while the isolation joint 34 mechanically couples the parts to each other. The isolation joint 34 electrically insulates the movable electrode finger 31 and the substrate 10 from each other. The isolation joint 34 according to the present embodiment is formed of silicon oxide ($SiO_2$).

The fixed electrode 40 is separated from the bottom surface 12*a* of the cavity 12 to the +Z side. The fixed electrode 40 includes two fixed electrode fingers 41A and 41B extending in the Y-direction and two beam portions 42A and 42B that respectively connect the two fixed electrode fingers 41A and 41B to the substrate 10. In the following description, in cases where the two fixed electrode fingers 41A and 41B does not particularly need to be distinguished from each other, one of the two fixed electrode fingers 41A and 41B may be referred to simply as a fixed electrode finger 41. Similarly, in the following description, in cases where the two beam portions 42A and 42B does not particularly need to be distinguished from each other, one of the two beam portions 42A and 42B may be referred to simply as a beam portion 42.

The fixed electrode finger 41 includes a conductive silicon (Si) layer. The two fixed electrode fingers 41A and 41B extend in the Y-direction, and are arranged side by side in the X-direction. The two fixed electrode fingers 41A and 41B are arranged with the movable electrode finger 31 interposed therebetween in the X-direction. The fixed electrode finger 41 is disposed so as to face the movable electrode finger 31 in the X-direction. The fixed electrode finger 41 is disposed at an interval G1 from the movable electrode finger 31 in the X-direction. The fixed electrode finger 41 according to the present embodiment is indirectly supported by the inner wall surface 13A via the beam portion 42.

The beam portion 42 couples the fixed electrode finger 41 to the inner wall surface 13A of the substrate 10. The beam portion 42 is cantilevered by the inner wall surface 13A of the substrate 10. The beam portion 42 projects and extends from the inner wall surface 13A extending in the X-direction and the Z-direction of the substrate 10 into the cavity 12. The beam portion 42 includes a first end portion 42*a* coupled to the substrate 10 and a second end portion 42*b* coupled to a +Y side end portion of the fixed electrode finger 41. The beam portion 42 includes a first beam 43 extending from the first end portion 42*a* to the +Y side as viewed in plan and a second beam 44 extending from a +Y side end portion of the first beam 43 to the movable electrode finger 31 side in the X-direction as viewed in plan. That is, the beam portion 42 according to the present embodiment is in substantially the shape of an L as viewed in plan.

The first beam 43 includes a conductive silicon (Si) layer. The first beam 43 is disposed alongside of the fixed electrode finger 41 in the X-direction. Specifically, the first beam 43 in the beam portion 42A is disposed on the −X side of the fixed electrode finger 41A, and the first beam 43 in the beam portion 42B is disposed on the +X side of the fixed electrode finger 41B. The first beam 43 according to the present embodiment extends linearly from the first end portion 42*a* to the +Y side.

The second beam 44 includes a conductive silicon (Si) layer. The second beam 44 extends linearly in the X-direction so as to couple the +Y side end portion of the first beam 43 and the +Y side end portion of the fixed electrode finger 41 to each other.

The beam portion 42 has an isolation joint 45 that crosses the first beam 43 in the X-direction and the Z-direction and severs the first beam 43 in the Y-direction. The isolation joint 45 electrically insulates parts on both sides of the beam portion 42 which parts are severed in the Y-direction by the isolation joint 45 from each other while the isolation joint 45 mechanically couples the parts to each other. The isolation joint 45 electrically insulates the fixed electrode finger 41 and the substrate 10 from each other. The isolation joint 45 according to the present embodiment is formed of silicon oxide ($SiO_2$).

The MEMS electrode 20 includes two electrode portions 50A and 50B configured to, when a voltage is applied thereto, deform the beam portion 42 by an electrostatic force and narrow the interval in the X-direction between the movable electrode finger 31 and the fixed electrode finger 41 as compared with the interval before the deformation of the beam portion 42. In the following description, in cases where the two electrode portions 50A and 50B does not particularly need to be distinguished from each other, one of the two electrode portions 50A and 50B may be referred to simply as an electrode portion 50.

The electrode portion 50 includes a first electrode finger 51 extending in the Y-direction and a second electrode finger 52 extending in the Y-direction and disposed at an interval from the first electrode finger 51 so as to face the first electrode finger 51 in the X-direction. The electrode portion 50A is disposed so as to be sandwiched between the fixed electrode finger 41A and the first beam 43 of the beam portion 42A in the X-direction. The electrode portion 50B is disposed so as to be sandwiched between the fixed electrode finger 41B and the first beam 43 of the beam portion 42B in the X-direction.

The first electrode finger 51 includes a conductive silicon (Si) layer. The first electrode finger 51 is coupled to the beam portion 42. Specifically, a +Y side end portion of the first electrode finger 51 is coupled to the second beam 44 of the beam portion 42. The first electrode finger 51 extends linearly from the second beam 44 to the −Y side. The first electrode finger 51 is disposed alongside of the first beam 43 in the X-direction. The first electrode finger 51 is electrically connected to the fixed electrode finger 41.

The second electrode finger 52 includes a conductive silicon (Si) layer. The second electrode finger 52 is fixed to the substrate 10. Specifically, the second electrode finger 52 is supported by the inner wall surface 13A of the substrate 10. The second electrode finger extends linearly from the inner wall surface 13A of the substrate 10 to the +Y side. The second electrode finger 52 is disposed alongside of the first electrode finger 51 in the X-direction. The second electrode finger 52 is disposed on the fixed electrode finger 41 side with respect to the first electrode finger 51 in the X-direction. In other words, the second electrode finger 52 is disposed so as to be interposed between the first electrode finger 51 and the fixed electrode finger 41 in the X-direction.

The electrode portion 50 has an isolation joint 53 that crosses the second electrode finger 52 in the X-direction and the Z-direction and severs the second electrode finger 52 in the Y-direction. The isolation joint 53 electrically insulates parts on both sides of the second electrode finger 52 which parts are severed in the X-direction by the isolation joint 53 from each other while the isolation joint 53 mechanically couples the parts to each other. The isolation joint 53 electrically insulates the second electrode finger 52 and the substrate 10 from each other. The isolation joint 53 according to the present embodiment is formed of silicon oxide ($SiO_2$).

When voltages different from each other are applied to the first electrode finger 51 and the second electrode finger 52, an electrostatic force that attracts the first electrode finger 51 and the second electrode finger 52 to each other acts on the first electrode finger 51 and the second electrode finger 52. As a result, the beam portion 42 is deformed such that the first electrode finger 51 is displaced so as to approach the second electrode finger 52. The deformation of the beam portion 42 causes the fixed electrode finger 41 to be displaced so as to approach the movable electrode finger 31.

In the present embodiment, a distance L1 in the X-direction between the first electrode finger 51 and the second electrode finger 52 is shorter than a distance L2 in the X-direction between the second electrode finger 52 and the fixed electrode finger 41.

The acceleration sensor 1 includes a regulating portion 60 supported by the substrate 10. The regulating portion 60 regulates the displacement of the fixed electrode finger 41 by coming into contact with the fixed electrode finger 41 when the beam portion 42 of the fixed electrode 40 is deformed by the electrostatic force and the fixed electrode finger 41 is thereby displaced toward the movable electrode finger 31 by a predetermined distance or more. Thus, the regulating portion 60 maintains the interval between the movable electrode finger 31 and the fixed electrode finger 41 at a predetermined interval (illustrated in FIG. 3).

The regulating portion 60 includes a main body 61 extending in the Y-direction and two projecting portions 62A and 62B respectively projecting from the main body 61 to both sides in the X-direction. In cases where the two projecting portions 62A and 62B does not particularly need to be distinguished from each other, one of the two projecting portions 62A and 62B may be referred to simply as a projecting portion 62.

The main body 61 includes a conductive silicon (Si) layer. The main body 61 is supported by the inner wall surface 13A of the substrate 10. The main body 61 projects from the inner wall surface 13A extending in the X-direction and the Z-direction of the substrate 10 into the cavity 12.

The projecting portion 62 includes a conductive silicon (Si) layer. The projecting portion 62A projects from a +Y side end portion of the main body 61 to the −X side. The projecting portion 62B projects from the +Y side end portion of the main body 61 to the +X side.

The regulating portion 60 has an isolation joint 63 that crosses the projecting portion 62 in the Y-direction and the Z-direction and severs the projecting portion 62 in the X-direction. The isolation joint 63 electrically insulates parts on both sides of the projecting portion 62 which parts are severed in the X-direction by the isolation joint 63 from each other while the isolation joint 63 mechanically couples the parts to each other. The isolation joint 63 electrically insulates a part facing the fixed electrode finger 41 in the projecting portion 62 and the substrate 10 from each other. The isolation joint 63 according to the present embodiment is formed of silicon oxide ($SiO_2$).

In the present embodiment, a distance L3 between the fixed electrode finger 41 and the regulating portion 60 in the X-direction is shorter than the distance L1 between the first electrode finger 51 and the second electrode finger 52 in the X-direction.

The acceleration sensor 1 includes electrode pads 70 to 73 between which and the MEMS electrode 20 electric signals (voltages) are input and output and an electrode pad 74 that inputs an electric signal to the substrate 10. The electrode pads 70 to 74 are arranged on the insulating layer 11.

The electrode pad 70 is electrically connected to the movable electrode 30 via a wiring layer 80. The wiring layer 80 is electrically insulated from the substrate 10 by the insulating layer 11. An output voltage is output from the electrode pad 70 as the capacitance of a first capacitor C1 and a second capacitor C2 to be described later changes.

The electrode pad 71 is electrically connected to the fixed electrode finger 41A via a wiring layer 81. A first input voltage as an alternating-current voltage is applied to the electrode pad 71. The first input voltage is thereby applied to the fixed electrode finger 41A, the beam portion 42A, and the first electrode finger 51 of the electrode portion 50A. The electrode pad 71 according to the present embodiment is electrically connected to a ground potential, and the first input voltage is 0 [V]. The wiring layer 81 is electrically insulated from the substrate 10 by the insulating layer 11.

The electrode pad 72 is electrically connected to the fixed electrode finger 41B via a wiring layer 82. A second input voltage as an alternating-current voltage is applied to the electrode pad 72. The second input voltage is thereby applied to the fixed electrode finger 41B, the beam portion 42B, and the first electrode finger 51 of the electrode portion 50B. The second input voltage according to the present embodiment is a power supply voltage ($V_{DD}$ [V]). The wiring layer 82 is electrically insulated from the substrate 10 by the insulating layer 11.

The electrode pad 73 is electrically connected to the second electrode finger 52 of the electrode portion 50A via a wiring layer 83, and is electrically connected to the second electrode finger 52 of the electrode portion 50B via a wiring layer 84. A third input voltage as an alternating-current voltage is applied to the electrode pad 73. The third input voltage is thereby applied to the second electrode finger 52 of the electrode portion 50A and the second electrode finger 52 of the electrode portion 50B. The electrode pad 73 according to the present embodiment is electrically connected to an intermediate potential between the potential of the electrode pad 71 and the potential of the electrode pad 72. The third input voltage is $V_{DD}/2$ [V].

The electrode pad 74 is electrically connected to the substrate 10 via a wiring layer 85.

Clock signals of opposite phase are applied to the two fixed electrode fingers 41A and 41B. In addition, clock signals interlocked with the clock signals applied to the two fixed electrode fingers 41A and 41B are applied to the respective second electrode fingers 52 of the two electrode portions 50A and 50B.

Acceleration Sensor 1 in State in which Voltages are Applied

Figure 3:
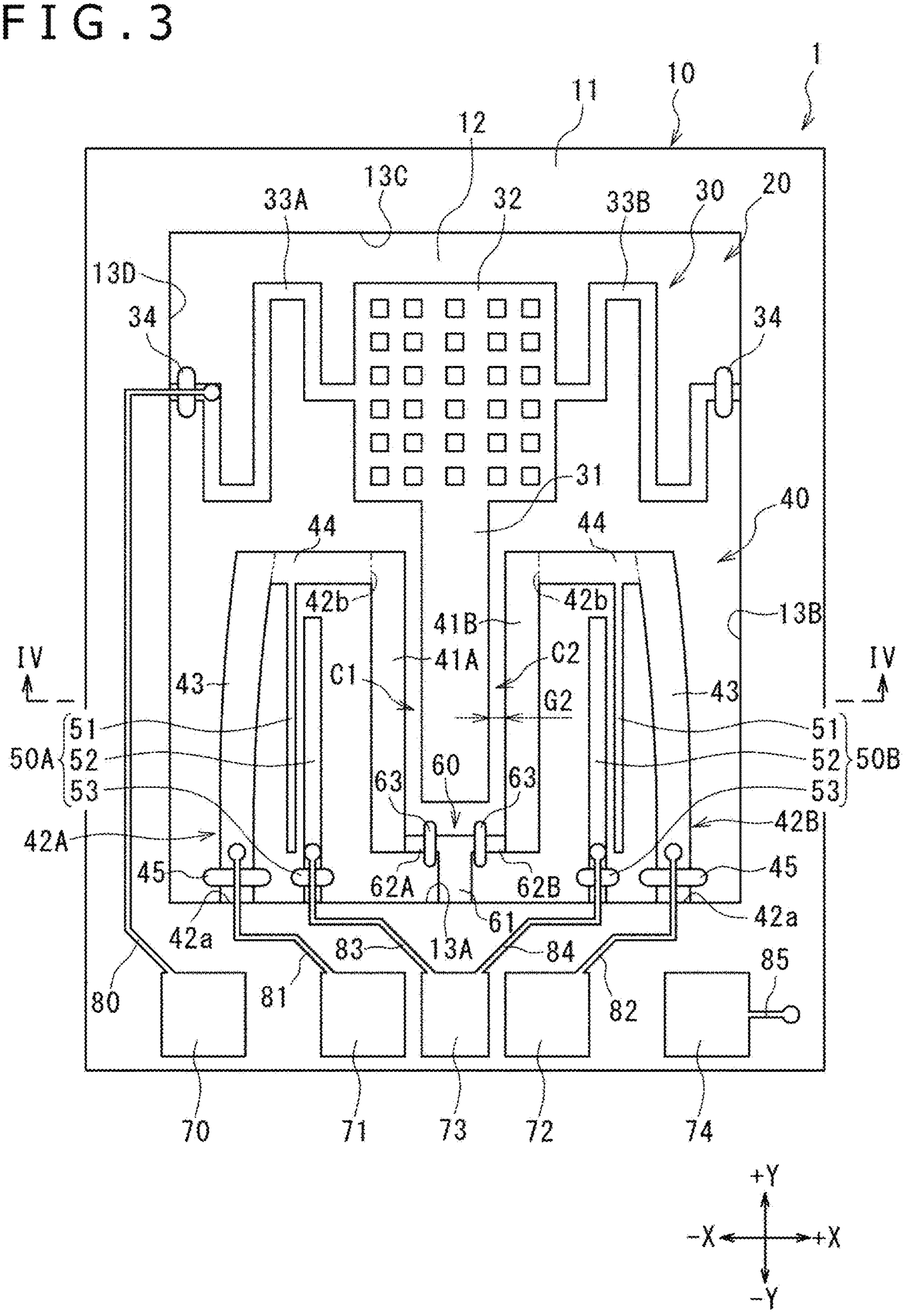
FIG. 3 is a plan view of the acceleration sensor in FIG. 1 in a state in which voltages are applied.
Figure 4:
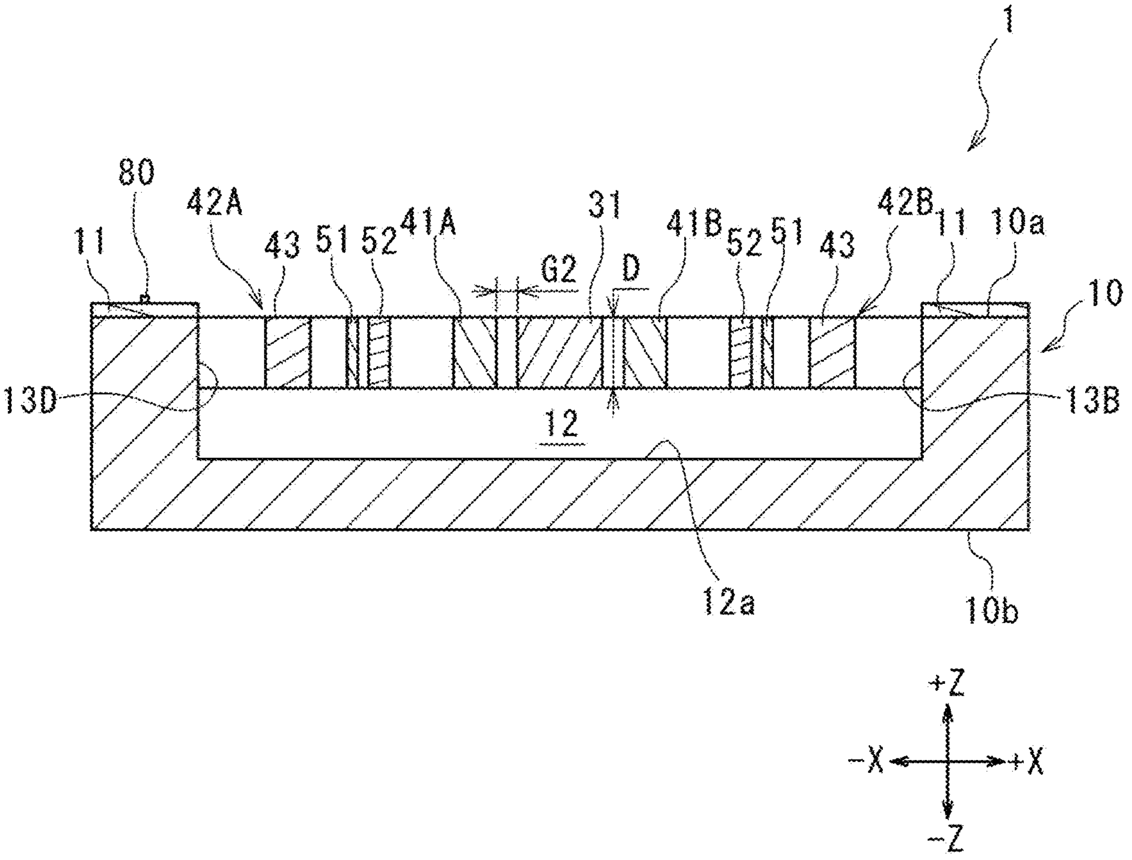
FIG. 4 is a sectional view taken along a line IV-IV of FIG. 3.

FIG. 3 is a schematic plan view of the acceleration sensor 1 in a state in which voltages are applied. FIG. 4 is a sectional view taken along a line IV-IV of FIG. 3. FIG. 3 and FIG. 4 illustrate the acceleration sensor 1 in a state in which the first input voltage is applied to the fixed electrode finger 41A, and the beam portion 42A, and the first electrode finger 51 of the electrode portion 50A, the second input voltage is applied to the fixed electrode finger 41B, the beam portion 42B, and the first electrode finger 51 of the electrode portion 50B, and the third input voltage is applied to the respective second electrode fingers 52 of the two electrode portions 50A and 50B.

In a state illustrated in FIG. 3, the first input voltage is applied to the first electrode finger 51 of the electrode portion 50A, and the third input voltage is applied to the second electrode finger 52 of the electrode portion 50A. In the electrode portion 50A, because the voltages different from each other are applied to the first electrode finger 51 and the second electrode finger 52, an electrostatic force that attracts the first electrode finger 51 and the second electrode finger 52 to each other acts on the first electrode finger 51 and the second electrode finger 52. The electrostatic force deforms the beam portion 42A such that the first electrode finger 51 of the electrode portion 50A is displaced to the +X side. Specifically, the first beam 43 of the beam portion 42A is deformed from the first end portion 42*a* to the +Y side so as to be curved to the fixed electrode finger 41A side, that is, the +X side. The deformation of the first beam 43 of the beam portion 42A causes the fixed electrode finger 41A to be displaced to the +X side so as to approach the movable electrode finger 31.

In the state illustrated in FIG. 3, the second input voltage is applied to the first electrode finger 51 of the electrode portion 50B, and the third input voltage is applied to the second electrode finger 52 of the electrode portion 50B. In the electrode portion 50B, because the voltages different from each other are applied to the first electrode finger 51 and the second electrode finger 52, an electrostatic force that attracts the first electrode finger 51 and the second electrode finger 52 to each other acts on the first electrode finger 51 and the second electrode finger 52. The electrostatic force deforms the beam portion 42B such that the first electrode finger 51 of the electrode portion 50B is displaced to the −X side. Specifically, the first beam 43 of the beam portion 42B is deformed from the first end portion 42*a* to the +Y side so as to be curved to the fixed electrode finger 41B side, that is, the −X side. The deformation of the first beam 43 of the beam portion 42B causes the fixed electrode finger 41B to be displaced to the −X side so as to approach the movable electrode finger 31.

As illustrated in FIG. 3, an interval G2 between the movable electrode finger 31 and the fixed electrode finger 41 in a state in which the voltages are applied is narrower than the interval G1 (illustrated in FIG. 1) between the movable electrode finger 31 and the fixed electrode finger 41 before the deformation of the beam portion 42. In addition, because the regulating portion 60 regulates a displacement of the fixed electrode finger 41 by a predetermined distance or more, the interval G2 between the movable electrode finger 31 and the fixed electrode finger 41 is maintained at a predetermined interval. In the present embodiment, the aspect ratio of a space between the movable electrode finger 31 and the fixed electrode finger 41 in the state in which the voltages are applied, that is, a depth D (illustrated in FIG. 4) of the movable electrode finger 31 and the fixed electrode finger 41 with respect to the interval G2 in the X-direction between the movable electrode finger 31 and the fixed electrode finger 41, that is, a ratio D/G2 of the dimension in the Z-direction is equal to or more than 100, for example.

In the acceleration sensor 1 according to the present embodiment, the movable electrode finger 31 and the fixed electrode finger 41A disposed so as to be adjacent on the −X side to the movable electrode finger 31 constitute a first capacitor C1. In addition, the movable electrode finger 31 and the fixed electrode finger 41B disposed so as to be adjacent on the +X side to the movable electrode finger 31 constitute a second capacitor C2.

When an acceleration in the X-direction acts on the acceleration sensor 1, the movable electrode finger 31 moves in the X-direction relative to the fixed electrode 40. The acceleration sensor 1 is configured to be able to detect the acceleration by extracting, as an electric signal from the electrode pad 70, a change in capacitance at each of the first capacitor C1 and the second capacitor C2 which change accompanies the displacement of the movable electrode 30 in the X-direction when the acceleration acts.

Effects

In a case where etching is performed between the movable electrode finger 31 and the fixed electrode finger 41, there is a limit to the aspect ratio of the etching, and therefore the interval between the movable electrode finger 31 and the fixed electrode finger 41 is widened according to the depth of the etching. In other words, in a case where the etching is performed with a predetermined depth between the movable electrode finger 31 and the fixed electrode finger 41, it is difficult to make the interval between the fixed electrode finger 41 and the movable electrode finger 31 narrower than a certain interval. On the other hand, according to this configuration, when different voltages are applied to the first electrode finger 51 and the second electrode finger 52 of the electrode portion 50, an electrostatic force that attracts the first electrode finger 51 and the second electrode finger 52 to each other acts on the first electrode finger 51 and the second electrode finger 52. This electrostatic force deforms the beam portion 42 such that the first electrode finger 51 is displaced so as to approach the second electrode finger 52. The deformation of the beam portion 42 causes the fixed electrode finger 41 to be displaced so as to approach the movable electrode finger 31. The interval G2 between the movable electrode finger 31 and the fixed electrode finger 41 in the state in which the voltages are applied can be consequently made narrower than the interval G1 before the deformation of the beam portion 42. It is thereby possible to narrow the interval G2 between the movable electrode finger 31 and the fixed electrode finger 41 more than the interval G1 formed between the fixed electrode finger 41 and the movable electrode finger 31 by the etching for forming the fixed electrode finger 41 and the movable electrode finger 31. As a result, the interval between the fixed electrode finger 41 and the movable electrode finger 31 can be narrowed regardless of the limit to the aspect ratio of the etching. It is therefore possible to improve sensitivity in the acceleration sensor 1.

According to the acceleration sensor 1 in accordance with the present embodiment, the regulating portion 60 restricts a displacement of the fixed electrode finger 41 in the X-direction. The interval G2 between the movable electrode finger 31 and the fixed electrode finger 41 can therefore be maintained at a predetermined interval regardless of a manufacturing error or a temperature change.

According to the acceleration sensor 1 in accordance with the present embodiment, the distance L3 between the fixed electrode finger 41 and the regulating portion 60 in the X-direction is shorter than the distance L1 between the first electrode finger 51 and the second electrode finger 52 in the X-direction. Thus, when the regulating portion 60 restricts a displacement of the fixed electrode finger 41 in the X-direction, the first electrode finger 51 and the second electrode finger 52 do not come into contact with each other. In other words, when the regulating portion 60 restricts a displacement of the fixed electrode finger 41 in the X-direction, the first electrode finger 51 and the second electrode finger 52 are arranged at an interval from each other. It is thereby possible to suppress a flow of a current between the first electrode finger 51 and the second electrode finger 52, and consequently suppress a decrease in sensitivity in the acceleration sensor 1.

Modification

Figure 5:
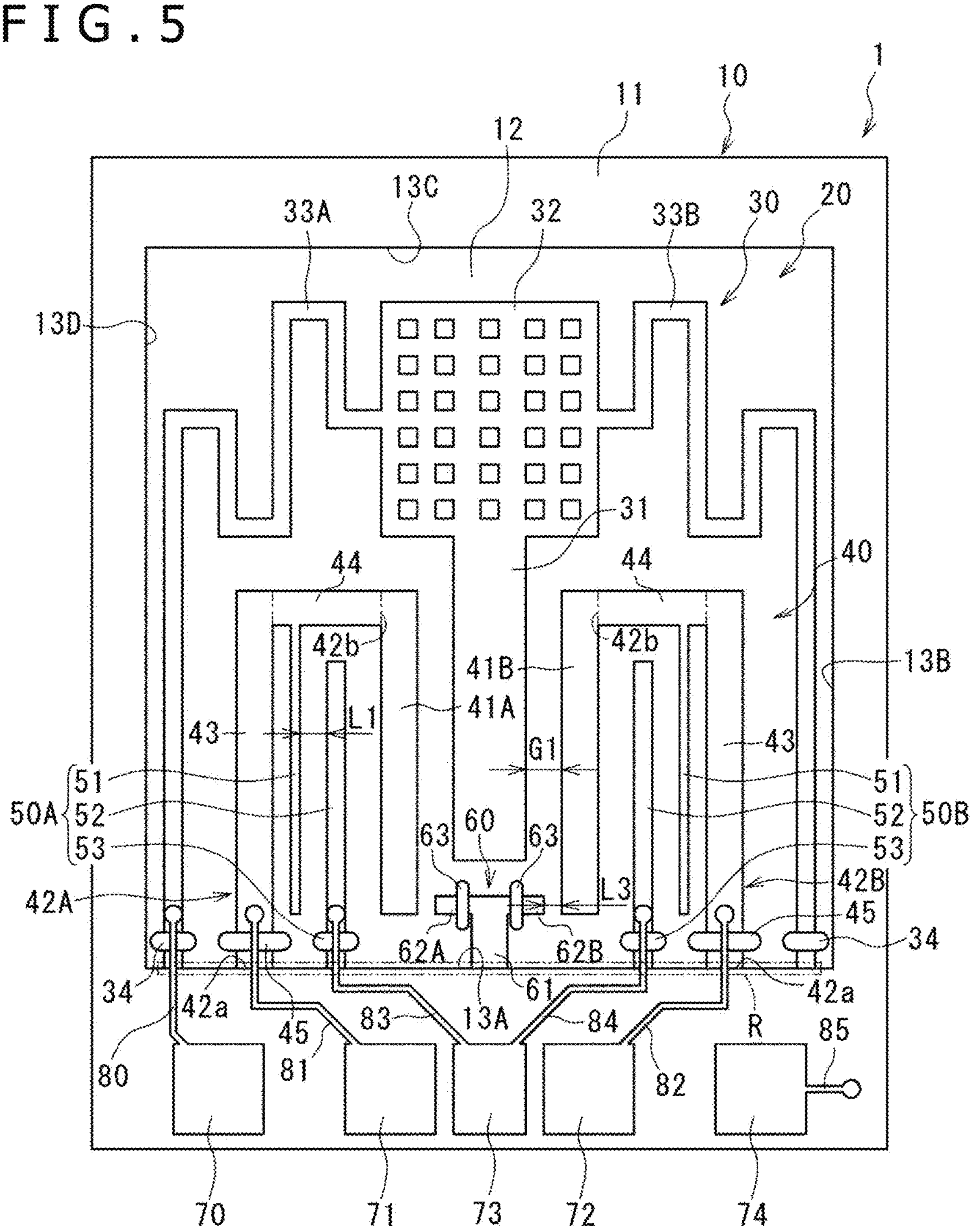
FIG. 5 is a plan view of an acceleration sensor according to a modification of the embodiment of the present disclosure.

FIG. 5 is a schematic plan view of an acceleration sensor 1 according to a modification of the present embodiment.

In the present modification, the spring portion 33 is cantilevered by the inner wall surface 13A of the substrate 10. The movable electrode finger 31 is thereby indirectly supported by the inner wall surface 13A of the substrate 10 via the base portion 32 and the spring portions 33A and 33B. The isolation joint 34 in the present modification crosses the spring portion 33 in the X-direction and the Z-direction, and severs the spring portion 33 in the Y-direction. The isolation joint 34 electrically insulates parts on both sides of the spring portion 33 which parts are severed in the Y-direction by the isolation joint 34 while the isolation joint 34 mechanically couples the parts to each other.

In the present modification, the movable electrode finger 31, the fixed electrode finger 41, the first electrode finger 51, the second electrode finger 52, and the regulating portion 60 are directly or indirectly supported by an anchor region R disposed in the inner wall surface 13A among the four inner wall surfaces 13A to 13D.

According to the acceleration sensor 1 in accordance with the present modification, the fixed electrode finger 41, the movable electrode finger 31, the first electrode finger 51, and the second electrode finger 52 are directly or indirectly supported by the anchor region R disposed in the inner wall surface 13A. Therefore, a package stress that can occur in the substrate 10 is transmitted to the MEMS electrode 20 via the anchor region R. As a result, a distortion that can occur in the MEMS electrode 20 is minimized easily as compared with a case where the MEMS electrode 20 is supported by a plurality of parts of the plurality of inner wall surfaces 13A to 13D and the package stress is transmitted from the plurality of parts to the MEMS electrode 20. As a result, the detection of the acceleration sensor 1 is stabilized easily.

Other Modifications

The MEMS device according to the present disclosure is not limited to the configuration of the foregoing embodiment, and is susceptible of various changes.

In the foregoing embodiment, description has been made of the acceleration sensor 1 as an example of the MEMS device. However, the MEMS device can be applied as various MEMS devices having a MEMS electrode. For example, the MEMS device according to the present disclosure may be a MEMS oscillator or an acceleration sensor.

In the foregoing embodiment, the acceleration sensor 1 has the regulating portion 60 but is not limited to this. That is, the acceleration sensor 1 may not have the regulating portion 60.

In the foregoing embodiment, the distance L3 between the fixed electrode finger 41 and the regulating portion 60 in the X-direction is shorter than the distance L1 between the first electrode finger 51 and the second electrode finger 52 in the X-direction, but is not limited to this. That is, the distance L3 between the fixed electrode finger 41 and the regulating portion 60 in the X-direction may be longer than the distance L1 between the first electrode finger 51 and the second electrode finger 52 in the X-direction.

The shape and structure of the beam portion 42 are not limited to those illustrated in the foregoing embodiment. The shape and structure of the beam portion 42 can be changed as long as the beam portion 42 is deformed by the electrostatic force acting between the first electrode finger 51 and the second electrode finger 52 of the electrode portion 50 and has a function of thereby making the interval G2 between the movable electrode finger 31 and the fixed electrode finger 41 after the deformation narrower than the interval G1 between the movable electrode finger 31 and the fixed electrode finger 41 before the deformation.

The arrangement, the shape, and the structure of the electrode portion 50 are not limited to those illustrated in the foregoing embodiment. The arrangement, the shape, and the structure of the electrode portion 50 can be changed as long as the electrode portion 50 has a function of deforming the beam portion 42 by an electrostatic force and thereby making the interval G2 between the movable electrode finger 31 and the fixed electrode finger 41 after the deformation of the beam portion 42 narrower than the interval G1 between the movable electrode finger 31 and the fixed electrode finger 41 before the deformation of the beam portion 42. For example, while the electrode portion 50 includes a pair of the first electrode finger 51 and the second electrode finger 52 in the foregoing embodiment, the electrode portion 50 is not limited to this, and may include a plurality of pairs of first electrode fingers 51 and second electrode fingers 52 that mesh with and face each other in a shape of comb teeth.

In the foregoing embodiment, the distance L1 in the X-direction between the first electrode finger 51 and the second electrode finger 52 is shorter than the distance L2 in the X-direction between the second electrode finger 52 and the fixed electrode finger 41, but is not limited to this. That is, the distance L1 in the X-direction between the first electrode finger 51 and the second electrode finger 52 may be longer than the distance L2 in the X-direction between the second electrode finger 52 and the fixed electrode finger 41.

In the foregoing embodiment, description has been made of a case where the substrate 10 is formed by only a single silicon layer. However, the substrate according to the present disclosure may include another layer such as a silicon oxide ($SiO_2$) layer or a silicon carbide (SiC) layer in addition to the silicon layer. For example, the substrate according to the present disclosure may be a silicone on insulator (SOI) substrate.

Supplementary Notes

The MEMS device according to the present disclosure provides the following aspects.

Aspect 1

There is provided a MEMS device including a substrate that has a first principal surface and a second principal surface facing the first principal surface, and in which a cavity recessed from the first principal surface side to the second principal surface side is disposed, and a MEMS electrode that is disposed within the cavity, and that is separated from a bottom surface of the cavity to the first principal surface side, the MEMS electrode including a movable electrode finger extending in a first direction, and connected to the substrate so as to be movable relative to the substrate, a fixed electrode finger extending in the first direction, and disposed at an interval from the movable electrode finger so as to face the movable electrode finger in a second direction intersecting the first direction, a beam portion cantilevered by the substrate, and coupling the fixed electrode finger to the substrate, and an electrode portion configured to, when a voltage is applied to the electrode portion, deform the beam portion by an electrostatic force, and make an interval in the second direction between the movable electrode finger and the fixed electrode finger narrower than the interval before the deformation of the beam portion, and the electrode portion including a first electrode finger extending in the first direction, and coupled to the beam portion, and a second electrode finger extending in the first direction, disposed at an interval from the first electrode finger so as to face the first electrode finger in the second direction, disposed to the fixed electrode finger side with respect to the first electrode finger in the second direction, and fixed to the substrate.

In a case where etching is performed between the movable electrode finger and the fixed electrode finger, there is a limit to the aspect ratio of the etching, and therefore the interval between the movable electrode finger and the fixed electrode finger is widened according to the depth of the etching. In other words, in a case where the etching is performed with a predetermined depth between the movable electrode finger and the fixed electrode finger, it is difficult to make the interval between the fixed electrode finger and the movable electrode finger narrower than a certain interval. On the other hand, according to the MEMS device in accordance with the first aspect, when different voltages are applied to the first electrode finger and the second electrode finger of the electrode portion, an electrostatic force that attracts the first electrode finger and the second electrode finger to each other acts on the first electrode finger and the second electrode finger. This electrostatic force deforms the beam portion such that the first electrode finger is displaced so as to approach the second electrode finger. The deformation of the beam portion causes the fixed electrode finger to be displaced so as to approach the movable electrode finger. The interval between the movable electrode finger and the fixed electrode finger in the state in which the voltages are applied can be consequently made narrower than the interval before the deformation of the beam portion. It is thereby possible to narrow the interval between the movable electrode finger and the fixed electrode finger more than the interval formed between the fixed electrode finger and the movable electrode finger by the etching for forming the fixed electrode finger and the movable electrode finger. As a result, the interval between the fixed electrode finger and the movable electrode finger can be narrowed regardless of the limit to the aspect ratio of the etching. It is therefore possible to improve sensitivity in the MEMS device.

Aspect 2

Provided is the MEMS device according to aspect 1, in which the substrate has a regulating portion configured to regulate a displacement of the fixed electrode finger by coming into contact with the fixed electrode finger when the fixed electrode finger is displaced toward the movable electrode finger by a predetermined distance or more.

Aspect 3

Provided is the MEMS device according to aspect 2, in which a distance between the fixed electrode finger and the regulating portion in the second direction is shorter than a distance between the first electrode finger and the second electrode finger in the second direction.

Aspect 4

Provided is the MEMS device according to any one of aspects 1 to 3, in which the substrate has a plurality of inner wall surfaces defining the cavity, and the fixed electrode finger, the movable electrode finger, the first electrode finger, and the second electrode finger are directly or indirectly supported by an anchor region disposed in one of the plurality of inner wall surfaces.

What is claimed is:

1. A micro electro mechanical system device comprising:

a substrate that has a first principal surface and a second principal surface facing the first principal surface, and in which a cavity recessed from the first principal surface side to the second principal surface side is disposed; and a micro electro mechanical system electrode that is disposed within the cavity, and that is separated from a bottom surface of the cavity to the first principal surface side, the micro electro mechanical system electrode including a movable electrode finger extending in a first direction, and connected to the substrate so as to be movable relative to the substrate, a fixed electrode finger extending in the first direction, and disposed at an interval from the movable electrode finger so as to face the movable electrode finger in a second direction intersecting the first direction, a beam portion cantilevered by the substrate, and coupling the fixed electrode finger to the substrate, and an electrode portion configured to, when a voltage is applied to the electrode portion, deform the beam portion by an electrostatic force, and make an interval in the second direction between the movable electrode finger and the fixed electrode finger narrower than the interval before the deformation of the beam portion, and the electrode portion including a first electrode finger extending in the first direction, and coupled to the beam portion, and a second electrode finger extending in the first direction, disposed at an interval from the first electrode finger so as to face the first electrode finger in the second direction, disposed to the fixed electrode finger side with respect to the first electrode finger in the second direction, and fixed to the substrate.

2. The micro electro mechanical system device according to claim 1, wherein the substrate has a regulating portion configured to regulate a displacement of the fixed electrode finger by coming into contact with the fixed electrode finger when the fixed electrode finger is displaced toward the movable electrode finger by a predetermined distance or more.

3. The micro electro mechanical system device according to claim 2, wherein a distance between the fixed electrode finger and the regulating portion in the second direction is shorter than a distance between the first electrode finger and the second electrode finger in the second direction.

4. The micro electro mechanical system device according to claim 1, wherein the substrate has a plurality of inner wall surfaces defining the cavity, and the fixed electrode finger, the movable electrode finger, the first electrode finger, and the second electrode finger are directly or indirectly supported by an anchor region disposed in one of the plurality of inner wall surfaces.

* * * * *